United States Patent [19]

Kamath et al.

[11] 4,028,147
[45] June 7, 1977

[54] LIQUID PHASE EPITAXIAL PROCESS FOR GROWING SEMI-INSULATING GAAS LAYERS

[75] Inventors: G. Sanjiv Kamath, Malibu; Bradley W. Smith, Oxnard, both of Calif.

[73] Assignee: Hughes Aircraft Company, Culver City, Calif.

[22] Filed: Aug. 16, 1976

[21] Appl. No.: 714,726

Related U.S. Application Data

[62] Division of Ser. No. 530,336, Dec. 6, 1974, Pat. No. 3,994,755.

[52] U.S. Cl. .................................. 148/171; 148/33; 252/62.3 GA; 357/18; 357/47
[51] Int. Cl.² ...................................... H01L 21/208
[58] Field of Search .......... 148/171, 172, 1.5, 175; 252/62.3 GA; 357/16, 18, 47

[56] References Cited

UNITED STATES PATENTS

| 3,344,071 | 9/1967  | Cronin .......................... 148/172 X |
| 3,607,463 | 9/1971  | Kinoshita et al. ..... 252/62.36 GA X |
| 3,623,905 | 11/1971 | Akai et al. ..................... 148/171 X |
| 3,697,336 | 10/1972 | Lamorte ........................ 148/171 |
| 3,846,191 | 11/1974 | Blum et al. ................... 148/171 X |
| 3,983,510 | 9/1976  | Hayashi et al. ................ 357/18 X |
| 3,994,755 | 11/1976 | Kamath .......................... 148/172 |

Primary Examiner—G. Ozaki
Attorney, Agent, or Firm—William J. Bethurum; W. H. MacAllister

[57] ABSTRACT

A process for forming a monolithic gallium arsenide structure having a plurality of electrically insulated gallium arsenide regions.

3 Claims, 10 Drawing Figures

LIQUID PHASE EPITAXIAL PROCESS FOR GROWING SEMI-INSULATING GAAS LAYERS

This is a division of application Ser. No. 530,336 filed Dec. 6, 1974, now U.S. Pat. No. 3,994,755.

FIELD OF THE INVENTION

This invention relates generally to an epitaxial process for depositing gallium arsenide layers and more particularly to an improved chromium doped gallium arsenide liquid phase epitaxial process featuring the improved control of impurity levels in semi-insulating gallium arsenide layers.

BACKGROUND

Chromium has been used for many years as a dopant in the fabrication of bulk gallium arsenide, and the purpose of such doping is to raise the resistivity of the gallium arsenide material and make it "semi-insulating". The term "semi-insulating" commonly refers to a resistivity range on the order of $10^7$–$10^8$ ohm.cm. Gallium arsenide substrates which are sliced from such semi-insulating GaAs bulk material may be subsequently used to electrically isolate semiconductor devices, one from another, which are fabricated in the substrate using state-of-the-art planar technology. Furthermore, the semi-insulating gallium arsenide substrate may be mounted on a suitable metallic heat sink without producing significant leakage currents between this heat sink and active semiconductor devices fabricated in the substrate. Therefore, the substantial utility of semi-insulating semiconductive material and particularly semi-insulating gallium arsenide is manifest.

The particular solid state mechanism by which a chromium atom reduces the conductivity in a gallium arsenide crystal is also well known in this art and involves introducing changes into the band gas energy of the gallium arsenide crystal. The chromium atom has deep energy levels between the valence band and the conduction band of the GaAs atomic lattice, thereby tying up available carriers from shallow N type levels, and hence raising the resistivity of the material.

PRIOR ART

There are several compound semiconductor processes for fabricating chromium-doped gallium arsenide, and these processes include the well known Bridgman technique in which liquid gallium and arsenic are deposited at separate locations in a closed tube which is passed through a predetermined temperature profile. This causes arsenic vapors to combine with the liquid gallium at one end of the tube and form the III–V compound gallium arsenide. Suitable amounts of chromium may be added to the gallium in order to make the bulk GaAs semi-insulating.

The above Bridgman technique requires that the closed reactor tube be exposed to a temperature profile which, typically, varies approximately linearly from about 600° C. to about 1250° C., and this latter high temperature will inevitably cause the silicon in the quartz tube, as well as other extraneous impurities in the crystal growth system, to be introduced into the gallium arsenide crystal grown during the process. Since silicon is the most common impurity introduced into the GaAs crystal during the Bridgman process, and since Si frequently occurs in the gallium melt to a level of approximately $10^{16}$ atoms per cubic centimeter, chromium must be added to the melt to compensate for this concentration of silicon and thereby yield approximately $10^{17}$ chromium atoms per cubic centimeter in the grown GaAs crystal. Since chromium has a segregation coefficient, Ks, of approximately $10^{-4}$ in a gallium solution, approximately $10^{21}$ chromium atoms per cubic centimeter must be added to the gallium melt in order to yield $10^{17}$ atoms/cc in the GaAs crystal. This means that about 0.3% of chromium by weight must be added to the gallium melt.

Such a high chromium concentration in the gallium melt greatly enhances the probability of forming precipitates and inhomogeneities in the grown GaAs crystal. Furthermore, the above required chromium level of $10^{21}$ atoms per cubic centimeter in the Ga melt is quite high, and this high concentration of Cr at the crystal growth front can exceed the $10^{21}$ atoms/cc in the melt by a considerable amount. The latter frequently causes the formation of aggregates and precipitates in the growing crystal, thereby reducing its quality both crystallographically and chemically.

Both the carrier mobilities and the lifetimes of carriers in the grown gallium arsenide crystal are also adversely affected by such high levels of chromium, which also produce uncontrolled effects on both epitaxial layers grown on chromium doped GaAs substrates and ion implanted PN junctions formed in these epitaxial layers. Variations in background chromium doping levels in the GaAs crystal make it difficult, if not impossible, to use gallium arsenide semi-insulating crystals grown by the Bridgman process for the fabrication of very small geometry devices, such as microwave diodes wherein very shallow PN junctions are required.

Some attempts have been made by workers in this art to grow chromium doped gallium arsenide crystals using vapor phase epitaxial (VPE) processes which require lower growth temperatures. This was done in an effort to reduce the silicon and other impurity levels that have to be compensated for by the addition of chromium atoms to the process. However, to date these lower temperature VPE processes have failed to produce good high quality semi-insulating chromium doped gallium arsenide with a low chromium concentration.

It is believed that the reason for such failure was due, at least in part, to the failure of these prior art VPE and LPE processes to utilize a sufficiently pure and clean crystal growth system substantially free from all impurities. For example, when one liquid phase epitaxial process of the prior art was utilized in an attempt to grow semi-insulating layers of gallium arsenide, it was suspected that the chromium used in the process may have had Group VI impurities, such as tellurium, in it, with the result that tellurium tends to prevent the gallium arsenide crystals from becoming semi-insulating. Since tellurium has a segregation coefficient, $K_s$, of 10, several parts per million of tellurium in the crystal growth system tend to mask the effect of chromium to make the material semi-insulating. Thus, only about ten parts per million of tellurium in the chromium would give rise to N type gallium arsenide crystals rather than semi-insulating gallium arsenide crystals. Only the removal of the tellurium atoms by some method would enable semi-insulating gallium arsenide material to be produced by this process, and to date, no such methods have been reported as far as known to us. If the tellurium or other N type impurities are not removed from the crystal growth system, these shallow impurities override the effect of the chromium atoms, which penetrate to deep levels within the crystal, with the net result of providing a low resistivity material of poor quality.

THE INVENTION

The general purpose of this invention is to provide a new and improved liquid phase epitaxial (LPE) process for depositing semi-insulating epitaxial layers of gallium arsenide having very low impurity levels, including chromium levels less than about $5\times10^{15}$ chromiums atoms per cubic centimeter. Our process may be carried out at relatively low liquid phase epitaxial growth temperatures on the order of 800° C or less, and the purity levels achieved with our process represent an improvement greater than an order of magnitude over the purity levels which may be achieved using the above described Bridgman processes.

To accomplish the above purpose, we initially provide a saturated chromium doped solution of gallium arsenide in gallium at a predetermined solution growth temperature on the order of 750° C. The chromium doped GaAs in Ga solution is placed in a highly purified hydrogen gas atmosphere which is achieved using one purifying gas chamber for the above solution of GaAs in Ga and another adjacent purifying gas chamber which surrounds the GaAs substrate prior to epitaxial deposition thereon. When a high vacuum valve between the two chambers is opened, the gallium arsenide substrate is brought into contact with the gallium arsenide in gallium solution, and during this liquid phase epitaxial deposition step, the chamber surrounding the GaAs in Ga solution is subjected only to the $H_2$ purified atmosphere previously surrounding the gallium arsenide substrate. The GaAs substrate is maintained in contact with the gallium arsenide melt for a predetermined time while the melt is slowly cooled below the 750° C melt saturation temperature. At this lower temperature the gallium arsenide deposits on the GaAs substrate as an epitaxial layer of monocrystalline semi-insulating gallium arsenide of extremely high purity.

Accordingly, it is an object of the present invention to provide a new and improved process for depositing semi-insulating layers of gallium arsenide on selected substrates.

Another object is to provide a process of the type described in which the levels of impurity concentrations in the GaAs semi-insulating epitaxial layers so produced are minimized, thereby improving the carrier lifetimes, mobilities and other electrical characteristics of the semi-insulating layers.

Another object is to provide a process of the type described in which the possibility of forming precipitates and inhomogeneous agglomerates in the epitaxially grown semi-insulating layer is greatly reduced.

A feature of the present invention is the provision of semi-insulating epitaxial gallium arsenide material having a sufficiently low background contamination so that planar processes, such as ion implantation, can be used to create very shallow PN junctions with uniform electrical characteristics at very low doping levels.

Another feature is the provision of a process of the type described which lends itself to the formation of semi-insulating epitaxial gallium arsenide islands on gallium arsenide substrates. This feature renders the process adaptable to monolithic fabrication techniques for forming planar devices and PN junctions in a gallium arsenide substrate. Such techniques include the utilization of the GaAs epitaxial layer as a passivating high resistivity surface layer which can also serve, for example, as an ion implantation mask equivalent to an $SiO_2$ mask on silicon.

These and other objects and features of the invention will become more readily apparent in the following description of the accompanying drawings.

DRAWINGS

Figure 1:
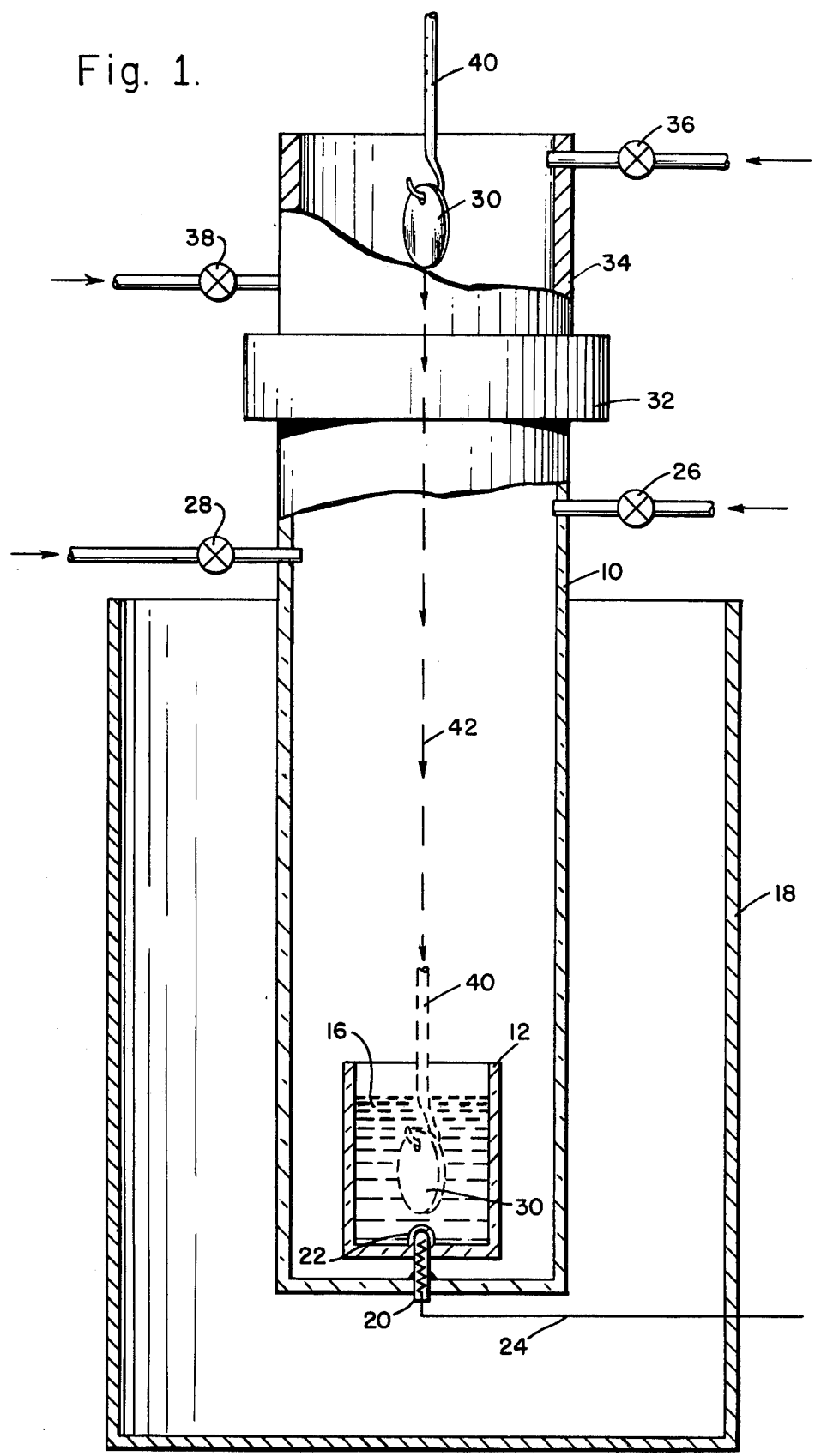
FIG. 1 is a schematic diagram, in partial cross section, of a suitable liquid phase epitaxial deposition apparatus for use in practicing the invention.

Referring now to FIG. 1, there is shown an elongated quartz tube 10 within which a quartz crucible 12 is centrally positioned and mounted on any suitable mounting means 14. The quartz crucible 12 is filled with a solution 16 of gallium arsenide in gallium, and this solution 16 becomes saturated with gallium arsenide at a temperature of approximately 800° C. The melt 16 is stabilized at approximately 800° C where the impurity concentration is less than about $2\times10^{14}$ atoms (of residual impurity such as Si) per cubic centimeter. For practical purposes, however, growth temperatures in a range of between 700° C and 900° C can be used for LPE growth if the GaAs in Ga solution is saturated. Generally, the solution under the above set of conditions yields P type layers, since Si has a shallow P type level under low temperatures of crystal growth.

Next the solution 16 is counter doped with a tin, Sn, concentration sufficient to produce N type GaAs epitaxial layers, with approximately $5\times10^{14}$ Sn atoms per cubic centimeter in the layers grown from the solution. Then, chromium is added to the melt 16 in sufficient quantity to compensate the N type impurity and provide a net P type characteristic to the layers produced. Since chromium has a segregation coefficient of $10^{-4}$, this means adding approximately 100 parts per million chromium to the melt 16. This produces a net Cr concentration in the grown layers of approximately $1\times10^{15}$ atoms of Cr per cubic centimeter.

The above 800° C GaAs saturation temperature is reached by means of a conventional furnace 18 which is used to raise the temperature of the gallium arsenide in gallium solution 16 to a desired level. Temperature control for the present process is provided by means of a suitable thermocouple 20 which is positioned as shown in a small receptacle 22 in the quartz crucible 12. The thermocouple 20 is operable in a known manner to generate a temperature control signal on line 24 which is used to precisely and continuously control the temperature of the solution 16 in a well known manner.

Prior to starting the liquid phase epitaxial process according to the present invention, the quartz tube 10 is filled with palladium (Pd) diffused hydrogen gas which enters the tube through an entrance valve 26 and exits the tube through an outlet valve 28. The hydrogen gas protects the melt from ambient impurities, such as oxygen, which may otherwise be introduced into the gallium arsenide in gallium solution 16 during the epitaxial process herein. From this time forward, the gallium solution is kept in a stream of hydrogen during a long series of epitaxial growth runs.

In order to even further ensure that the present liquid phase epitaxial process is insulated to a maximum degree against impurities from both outside and inside the deposition chamber 10, the gallium arsenide wafer 30 enters the quartz tube 10 through a high vacuum valve 32 which separates the tube 10 from a second, buffer or entrance chamber 34. The chamber 34 is likewise flushed completely with a palladium diffused hydrogen gas which enters the chamber through a valve 36 and is removed through an exit valve 38. The chamber 34 is completely flushed and filled with pure $H_2$ prior to starting the present liquid phase epitaxial process.

Once the chamber 34 is completely flushed with $H_2$ for a time sufficient to remove all significant impurities therefrom, the high vacuum valve 32 is opened and the gallium arsenide wafer 30 is lowered through the valve 30 by means of a conventional push rod 40. This rod is shown at 42 in its extended position, with the GaAs wafer 30 now totally immersed in the gallium arsenide in gallium solution 16. With the gallium arsenide wafer 30 now in the position shown in the solution 16, the solution 16 is slowly cooled at a predetermined cooling rate beneath the 800° C saturation temperature, and during this process the gallium arsenide will epitaxially deposit on the wafer 30 by the liquid phase epitaxial growth process.

Using the present process, we have grown very thin and uniform GaAs semi-insulating epitaxial layers which are extremely useful in the fabrication of very small geometry, high frequency microwave devices, such as microwave diodes and field effect transistors.

Figure 2A:
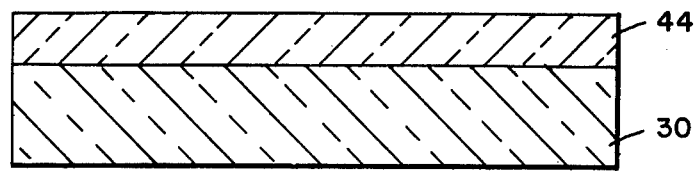
FIG. 2a illustrates, in schematic cross section, an epitaxial wafer produced in accordance with the present process.

FIG. 2a depicts, in schematic diagram, a complete GaAs epitaxial wafer fabricated in accordance with the present process and including the original gallium arsenide substrate 30 and a chromium-doped semi-insulating epitaxial layer 44 having a resistivity typically in the range of $10^7$–$10^8$ ohm.centimeters. The epitaxial wafer in FIG. 2a may be further cleaned and polished and then sold in the form shown therein by electronic material manufacturers to semiconductor device manufacturers for the use by the latter in the fabrication of semiconductor devices and integrated circuits. Therefore, the epitaxial wafer in FIG. 2a has utility per se as a substructure useful in the manufacture of electronic solid state components.

Figure 2B:
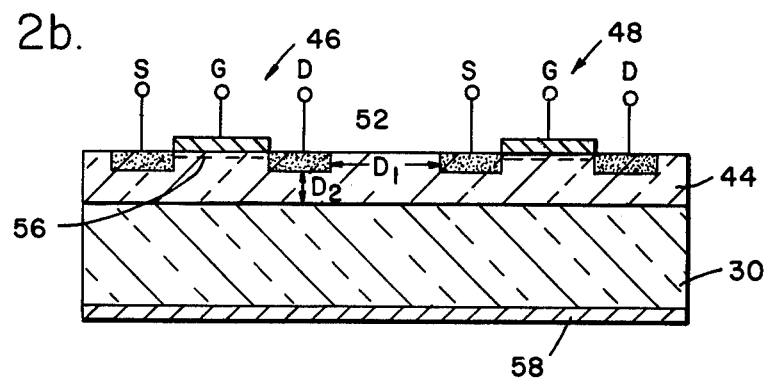
FIG. 2b illustrates, in schematic cross section, typical field effect devices which may be fabricated in the GaAs epitaxial layer produced by the present invention.

On the other hand, the GaAs epitaxial wafer in FIG. 2a may be further processed in order to support and electrically isolate a plurality of semiconductor devices, such as a pair of adjacent field effect transistors, designated generally 46 and 48 in FIG. 2b. These field effect devices 46 and 48 will typically have source and drain regions 50 and 52 which may be formed by diffusion, ion implantation or other suitable means for selectively introducing impurities into the epitaxial layer 44. The devices 46 and 48 will also typically include a metallic gate region 54, and source, gate, and drain electrodes designated S, G and D, respectively. A control voltage applied to the gate electrode G serves to produce a channel region 56 beneath the gate 54 and extending between the source and drain regions 50 and 52. The conductivity of the channel region 56 may, of course, be varied in accordance with the level of potential applied to the gate electrode G.

Thus, the present invention makes possible the necessary electrical isolation of two side-by-side field effect devices 46 and 48. The lateral distance D in FIG. 2b between adjacent FET devices may be made very small because of the fact that the epitaxial layer 44 is semi-insulating. Not only does the GaAs epitaxial layer 44 provide the lateral isolation between the adjacent devices 46 and 48, but it also provides a vertical isolation at dimension $D_2$ in order to prevent unacceptable leakage currents from flowing between the two devices 46 and 48 and a metal heat sink member 58 upon which the gallium arsenide substrate 30 is mounted. This heat sink member 58 may also serve as a commmon ground connection for the two devices 46 and 48, in which case unacceptable leakage currents would flow from the two devices to the heat sink 58 in the absence of a high resistivity semi-insulating material in the $D_2$ dimension of FIG. 2b.

Figure 3A:
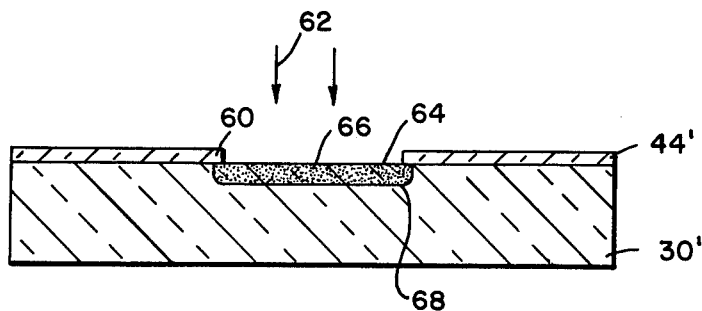
FIGS. 3a and 3b illustrate, in schematic cross section, the utilization of the present epitaxial layer as a passivation coating and as an ion implantation mask for producing a PN junction device in GaAs.
Figure 3B:
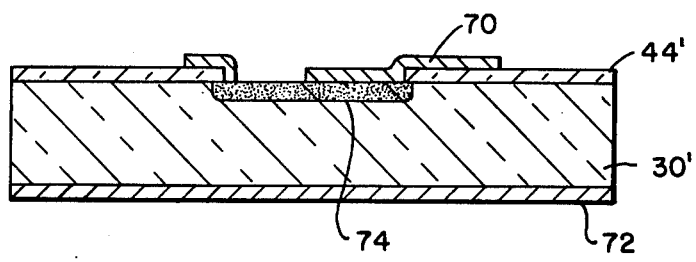

Referring now to FIGS. 3a and 3b, these figures illustrate the utilization of the present process to form an impurity mask 44' on the surface of the gallium arsenide wafer 30'. The impurity mask 44' may be used in substantially the same way that a silicon dioxide mask is used on the surface of a silicon wafer (not shown) to define and control the geometry of PN junction devices formed in the silicon wafer. Thus, if the semi-insulating layer 44' is grown sufficiently thick and an opening 60 is subsequently formed therein using conventional photoresist processes, then an impurity ion beam 62 may be focused on the exposed surface area 64 of the gallium arsenide wafer 30 in order to produce an ion implanted region 66 defined by a PN junction 68. Upon heating, the PN junction 68 will diffuse laterally a finite amount and terminate beneath the high resistivity epitaxial layer 44' which will serve to passivate the PN junction 68 at the epitaxial layer-substrate interface. If the epitaxial layer 44' is grown sufficiently thick, then the ion beam 62 will not penetrate completely through the epitaxial layer 44', nor will the impurity ions 62 sufficiently alter the resistivity of the layer 44' so as to adversely detract from its PN junction passivation characteristics. Thus, the process of the present invention is capable of forming an impurity mask 44' on the surface of the wafer 30' without resorting to the growth of silicon dioxide ($SiO_2$) on gallium arsenide, which at best is a difficult process because of the material dissimilarities between silicon and gallium arsenide.

The structure in FIG. 3a may be further modified by adding upper and lower device contacts 70 and 72 as shown in FIG. 3b, and conventional metal contact deposition processes may be used to form these contacts. The structure in FIG. 3b may, for example, be used as a Schottky barrier diode by the formation of a Schottky barrier at the metal-gallium arsenide interface 74. If the original substrate material 30' is sufficiently high in resistivity, or semi-insulating, then many of these Schottky barrier diodes may be formed in the substrate 30' in a like manner and there be electrically isolated, one from another, in a manner previously described.

On the other hand, the ion implanted region 66 may be used as an ion implanted resistor, in which case another contact (not shown) would be made at the left hand end of region 66 to connect this resistor in series between the latter contact and the existing metal contact 72.

Figure 4A:
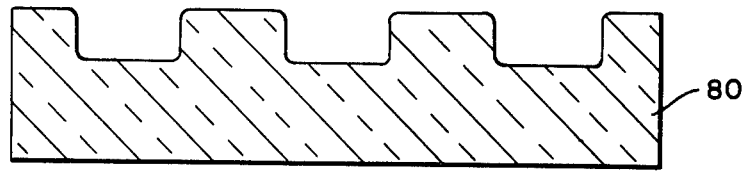
FIGS. 4a–4e illustrate in schematic cross section, the construction of semi-insulated planar GaAs islands in a structure which may be used for a monolithic solid state display.

Referring now to FIGS. 4a through 4e, there is shown in FIG. 4a a gallium arsenide substrate 80 which has been etched out using conventional photolithographic masking and etching techniques in order to form a plurality of recesses 81 in the upper surface regions of the substrate. The etched out substrate 80 in FIG. 4a is then transferred to the crystal growth apparatus of FIG. 1 in order to grow, by liquid phase epitaxial deposition, a thin layer 82 of semi-insulating gallium arsenide on the order of 10 to 15 microns in thickness.

Figure 4B:
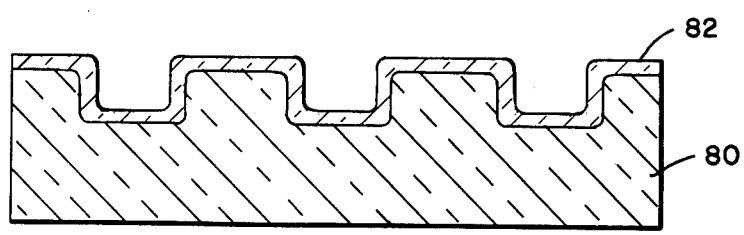
Figure 4C:
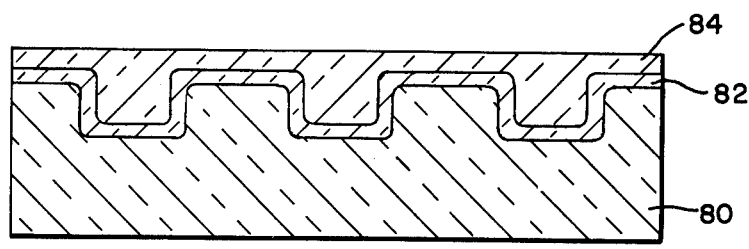

Next, the substructure in FIG. 4b is removed from the apparatus of FIG. 1 and transferred to a standard liquid or vapor phase epitaxial system wherein an ordinary N type layer 84 of gallium arsenide is epitaxially deposited as shown in FIG. 4c on the upper surface of the semi-insulating gallium arsenide layer 82. Thereafter, the substructure in FIG. 4c is lapped and polished in order to remove the excess portions of the N type gallium arsenide layer 84, thereby leaving a plurality of dielectrically isolated gallium arsenide planar islands 86, 88, and 90, all of which are electrically insulated, one from another, by the previously formed semi-insulating gallium arsenide layer 82.

Figure 4D:
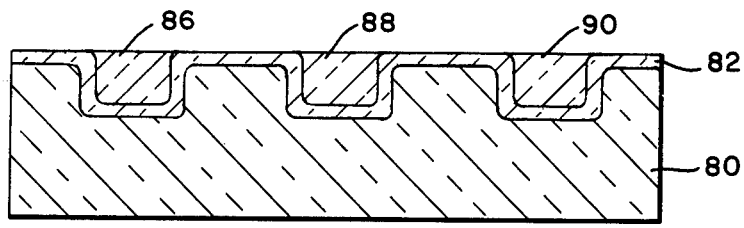
Figure 4E:
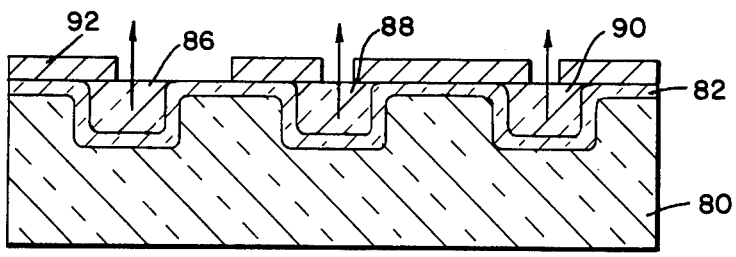

The structure in FIG. 4d may then be transferred to a conventional masking and metal deposition system wherein suitable metallization patterns 92 may be deposited on the upper surface of the structure of FIG. 4d to thus form the completed monolithic solid state display device as shown in FIG. 4e. However, it will be understood and appreciated by those skilled in the art that the structure in 4d, and particularly the epitaxial gallium arsenide islands 86, 88, and 90 therein, may be further treated to form light emitting PN junction devices in these islands, and standard semiconductor processes such as diffusion and ion implantation may be utilized to form these PN junctions (not shown) in one or more of these epitaxial insulated islands 86, 88, or 90. Alternatively, however, one or more of these islands may be used in the fabrication of other circuit components, such as ordinary diodes, resistors, gallium arsenide transistors in order that the structure in FIG. 4d may house a complete combination solid state display and associated integrated circuitry such as transistors, diodes, resistors and the like for driving such solid state display.

The present invention is not limited to the particular device structure illustrated in FIG. 4, and may also be used in the fabrication of other novel device structures which require an insulating or semi-insulating GaAs coating in the fabrication thereof. For example, GaAs field effect transistors may be fabricated using the teachings of the present invention, and semi-insulating GaAs may be deposited on either a GaAs substrate or a GaAs epitaxial layer into which the FET source, drain and channel regions are formed. Thus, this semi-insulating GaAs surface layer would be the equivalent of the SiO$_2$ surface passivation layer which is used in the fabrication of silicon MOSFETS, such as those described in U.S. Pat. No. 3,472,712 of R. W. Bower. Standard photolithographic photoresist masking and etching techniques may be used to define the extent of the semi-insulating layer, as well as to control the overall geometry of the field effect device structure.

The use of semi-insulating GaAs on semiconducting GaAs will overcome the crystal mismatch problems which are frequently encountered when one attempts to grow or deposit SiO$_2$ on GaAs. As in the above Bower patent, a metal gate electrode must be deposited on a portion of the semi-insulating layer atop the GaAs channel region, and voltages applied to this gate electrode may be used to vary the FET channel conductivity by AC coupling, while being DC isolated from the channel region by means of the semi-insulating layer.

What is claimed is:

1. A process for forming a monolithic gallium arsenide structure having a plurality of electrically insulated gallium arsenide regions therein comprising the steps of:
   a. providing a gallium arsenide substrate,
   b. removing preselected portions of said gallium arsenide substrate in order to form ridges and valleys adjacent one surface thereof,
   c. forming a thin layer of semi-insulating gallium arsenide on said one surface of said substrate and covering said ridges and valleys thereof,
   d. forming an epitaxial layer of gallium arsenide on the surface of said semi-insulating layer; and
   e. removing excess portions of said epitaxial layer extending beyond said semi-insulating layer to thereby expose portions of said semi-insulating layer and leave a plurality of electrically isolated gallium arsenide islands in the valleys of said substrate, whereby said islands may be utilized in the fabrication of gallium arsenide light emitting devices, as well as gallium arsenide monolithic circuitry for driving said gallium arsenide light emitting devices.

2. The process defined in claim 1 wherein said semi-insulating layer is formed by the liquid phase epitaxial deposition of chromium doped gallium arsenide on one surface of said substrate, whereby the subsequently formed islands of gallium arsenide are electrically insulated from said substrate by a relatively high resistivity in excess of $10^5$ ohm.centimeters.

3. The process defined in claim 2 which further includes depositing regions of metallization on selected portions of said electrically insulated gallium arsenide islands to provide electrical contact to semiconductor devices formed therein.

* * * * *